United States Patent
Ayyapureddi

(10) Patent No.: US 12,014,797 B2
(45) Date of Patent: Jun. 18, 2024

(54) APPARATUSES, SYSTEMS, AND METHODS FOR MANAGING METADATA STORAGE AT A MEMORY

(71) Applicant: MICRON TECHNOLOGY, INC., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 207 days.

(21) Appl. No.: 17/731,024

(22) Filed: Apr. 27, 2022

(65) Prior Publication Data

US 2023/0352064 A1 Nov. 2, 2023

(51) Int. Cl.
*G11C 7/10* (2006.01)
*G06F 12/06* (2006.01)

(52) U.S. Cl.
CPC ............ *G11C 7/1039* (2013.01); *G06F 12/06* (2013.01); *G11C 7/1012* (2013.01); *G11C 7/1048* (2013.01); *G11C 7/1069* (2013.01); *G11C 7/1096* (2013.01)

(58) Field of Classification Search
CPC ..... G06F 12/06; G06F 12/0246; G11C 16/08; G11C 2029/1806; G11C 11/1653; G11C 11/4087; G11C 8/10; G11C 7/1012; G11C 7/1069; G11C 7/1096; G11C 7/1048; G11C 7/1039; G11C 8/00; G11C 11/407; G11C 11/413; G11C 11/4085
USPC ...................... 711/100, 105; 365/230.06, 231
See application file for complete search history.

(56) References Cited

U.S. PATENT DOCUMENTS

| | | | |
|---|---|---|---|
| 9,158,617 | B2 | 10/2015 | Cho et al. |
| 10,127,101 | B2 | 11/2018 | Halbert et al. |
| 10,243,590 | B1 | 3/2019 | Seshadri |
| 10,817,371 | B2 | 10/2020 | Rooney et al. |
| 11,074,126 | B2 | 7/2021 | Prather et al. |
| 11,579,971 | B2 | 2/2023 | Ayyapureddi |
| 11,615,861 | B2 | 3/2023 | Kim et al. |
| 2008/0089129 | A1 | 4/2008 | Lee |
| 2008/0313493 | A1 | 12/2008 | Roohparvar et al. |

(Continued)

OTHER PUBLICATIONS

U.S. Appl. No. 17/730,381, titled "Apparatuses, Systems, and Methods for Per Row Error Scrub Information", filed Apr. 27, 2022; pp. all pages of application as filed.

(Continued)

*Primary Examiner* — Sanjiv Shah
*Assistant Examiner* — Edward Waddy, Jr.
(74) *Attorney, Agent, or Firm* — Dorsey & Whitney LLP

(57) ABSTRACT

Apparatuses, systems, and methods for managing storage and retrieval of metadata at a memory. A metadata column address generator, during an metadata access operation, is configured to decode a subset of less than all of the bits of the column address to determine a metadata column address and a metadata column plane address corresponding to a particular one of column planes of a memory array. A column decoder is configured to facilitate a double cycle access operation to write data to or retrieve data from the plurality of column planes based on the column address and to write metadata to or retrieve metadata from a particular column corresponding to the metadata column address of the particular one of the column planes corresponding to the column plane address.

26 Claims, 5 Drawing Sheets

(56) References Cited

U.S. PATENT DOCUMENTS

| | | | |
|---|---|---|---|
| 2009/0132876 A1 | 5/2009 | Freking et al. | |
| 2009/0196103 A1* | 8/2009 | Kim | G11C 16/0483 365/185.23 |
| 2010/0177582 A1 | 7/2010 | Kim et al. | |
| 2013/0117630 A1 | 5/2013 | Kang | |
| 2015/0193464 A1 | 7/2015 | Kwon et al. | |
| 2017/0060681 A1 | 3/2017 | Halbert et al. | |
| 2017/0091025 A1 | 3/2017 | Ahn et al. | |
| 2017/0269992 A1 | 9/2017 | Bandic et al. | |
| 2017/0344423 A1 | 11/2017 | Hsiao et al. | |
| 2018/0121283 A1 | 5/2018 | Plants | |
| 2020/0019462 A1 | 1/2020 | Prather et al. | |
| 2020/0104205 A1 | 4/2020 | Noguchi et al. | |
| 2020/0104208 A1* | 4/2020 | Heo | G06F 11/1044 |
| 2020/0226039 A1 | 7/2020 | Lee | |
| 2021/0142860 A1 | 5/2021 | Song et al. | |
| 2021/0208967 A1 | 7/2021 | Cha et al. | |
| 2021/0247910 A1 | 8/2021 | Kim et al. | |
| 2021/0311830 A1 | 10/2021 | Lee | |
| 2021/0358559 A1* | 11/2021 | Suh | G11C 29/18 |
| 2023/0161665 A1 | 5/2023 | Choi et al. | |
| 2023/0185665 A1 | 6/2023 | Ayyapureddi | |
| 2023/0350581 A1 | 11/2023 | Ayyapureddi | |
| 2023/0350748 A1 | 11/2023 | Ayyapureddi | |
| 2023/0352112 A1 | 11/2023 | Ayyapureddi | |

OTHER PUBLICATIONS

U.S. Appl. No. 17/730,396, titled "Apparatuses, Systems, and Methods for Per Row Error Scrub Information Registers", filed Apr. 27, 2022; pp. all pages of application as filed.
U.S. Appl. No. 17/730,992 titled "Apparatuses, Systems, and Methods for Managing Metadata Security and Access" filed Apr. 27, 2022; pp. all pages of application as filed.
International Application No. PCT/US24/13516, titled "Apparatuses, Systems, and Methods for Storing Memory Metadata" filed Jan. 30, 2024, pp. all pages of application as filed.
U.S. Appl. No. 18/424,282 titled "Apparatuses and Methods for Bounded Fault Compliant Metadata Storage" filed Jan. 26, 2024, pp. all pages of application as filed.
U.S. Appl. No. 18/424,342 titled "Apparatuses and Methods for Bounded Fault Compliant Metadata Storage" filed Jan. 26. 2024, pp. all pages of application as filed.
U.S. Appl. No. 18/430,381, titled "Apparatuses, Systems, and Methods for Storing Memory Metadata", filed Feb. 1, 2024; pp. all pages of application as filed.
U.S. Appl. No. 18/430,406, titled "Apparatuses, Systems, and Methods for Storing Memory Metadata", filed Feb. 1, 2024; pp. all pages of application as filed.
U.S. Appl. No. 18/431,232, titled "Apparatuses, Systems, and Methods for Storing Memory Metadata", filed Feb. 2, 2024; pp. all pages of application as filed.
U.S. Appl. No. 18/431,306, titled "Apparatuses, Systems, and Methods for Storing Memory Metadata", filed Feb. 2, 2024; pp. all pages of application as filed.
U.S. Appl. No. 18/504,215 titled "Apparatuses and Methods for Enhanced Metadata Support" filed Nov. 8, 2023, pp. all pages of application as filed.
U.S. Appl. No. 18/504,234 titled "Apparatuses and Methods for Enhanced Metadata Support" filed Nov. 8, 2023, pp. all pages of application as filed.
U.S. Appl. No. 18/504,302 titled "Apparatuses and Methods for Configurable ECC Modes" filed Nov. 8, 2023, pp. all pages of application as filed.
U.S. Appl. No. 18/504,316 titled "Apparatuses and Methods for Configurable Ecc Modes" filed Nov. 8, 2023, pp. all pages of application as filed.
U.S. Appl. No. 18/504,324 titled "Apparatuses And Methods For Single-Pass Access Of ECC Information, Metadata Information Or Combinations Thereof" filed Nov. 8, 2023, pp. all pages of application as filed.
U.S. Appl. No. 18/504,342 titled "Apparatuses and Methods for Single-Pass Access of ECC Information, Metadata Information or Combinations Thereof" filed Nov. 8, 2023, pp. all pages of application as filed.
U.S. Appl. No. 18/504,353 titled "Apparatuses and Methods for Separate Write Enable for Single-Pass Accessof Data, Metadata, and Parity Information" filed Nov. 8, 2023, pp. all pages of application as filed.
U.S. Appl. No. 18/504,362 titled "Apparatuses and Methods for Separate Write Enable for Single-Pass Access of Data, Metadata, and Parity Information" filed Nov. 8, 2023, pp. all pages of application as filed.
International Application No. PCT/US23/76430 titled "Apparatuses and Methods for Separate Write Enable for Single-Pass Access of Data, Metadata, and Parity Information" filed Oct. 10, 2023, pp. all pages of application as filed.
International Application No. PCT/US23/76433 titled "Apparatuses and Methods for Single-Pass Access of ECC Information, Metadata Information or Combinations Thereof" filed Oct. 10, 2023, pp. all pages of application as filed.
U.S. Appl. No. 18/441,775 titled "Apparatuses and Methods for Settings for Adjustable Write Timing" filed Feb. 14, 2024, pp. all pages of the application as filed.
U.S. Appl. No. 18/441,830 titled "Apparatuses, Systems, and Methods for Storing and Accessing Memory Metadata and Error Correction Code Data" filed Feb. 14, 2024, pp. all pages of the application as filed.

* cited by examiner

300 x8 8B

| Col Start | Col End | MetaData Column |
|---|---|---|
| 0 | 7 | 56 |
| 8 | 15 | 57 |
| 16 | 23 | 58 |
| 24 | 31 | 59 |
| 32 | 39 | 60 |
| 40 | 47 | 61 |
| 48 | 55 | 62 |
| Not Used | | 63 |

| CA Start | CA End | MetaData Address | MetaData Column Plane |
|---|---|---|---|
| 000 000 | 000 111 | 111 000 | 0+LSB, 1+LSB |
| 001 000 | 001 111 | 111 001 | 0+LSB, 1+LSB |
| 010 000 | 010 111 | 111 010 | 0+LSB, 1+LSB |
| 011 000 | 011 111 | 111 011 | 0+LSB, 1+LSB |
| 100 000 | 100 111 | 111 100 | 0+LSB, 1+LSB |
| 101 000 | 101 111 | 111 101 | 0+LSB, 1+LSB |
| 110 000 | 110 111 | 111 110 | 0+LSB, 1+LSB |

301 x8 4B

| Col Start | Col End | MetaData Column |
|---|---|---|
| 0 | 15 | 60 |
| 16 | 31 | 61 |
| 32 | 47 | 62 |
| 48 | 59 | 63 |

| CA Start | CA End | MetaData Address | MetaData Column Plane |
|---|---|---|---|
| 000 000 | 001 111 | 111 100 | 4LSB |
| 010 000 | 010 111 | 111 101 | 4LSB |
| 100 000 | 100 111 | 111 110 | 4LSB |
| 110 000 | 110 111 | 111 111 | 4LSB |

302 x4 4B

| Col Start | Col End | MetaData Column |
|---|---|---|
| 0 | 15 | 60 |
| 16 | 31 | 61 |
| 32 | 47 | 62 |
| 48 | 59 | 63 |

| CA Start | CA End | MetaData Address | MetaData Column Plane |
|---|---|---|---|
| 000 000 | 001 111 | 111 100 | CA10, 3 LSB |
| 010 000 | 010 111 | 111 101 | CA10, 3 LSB |
| 100 000 | 100 111 | 111 110 | CA10, 3 LSB |
| 110 000 | 110 111 | 111 111 | CA10, 3 LSB |

303 x4 8B

| Col Start | Col End | MetaData Column |
|---|---|---|
| 0 | 7 | 56 |
| 8 | 15 | 57 |
| 16 | 23 | 58 |
| 24 | 31 | 59 |
| 32 | 39 | 60 |
| 40 | 47 | 61 |
| 48 | 55 | 62 |
| Not Used | | 63 |

| CA Start | CA End | MetaData Address | MetaData Column Plane |
|---|---|---|---|
| 000 000 | 000 111 | 111 000 | CA10, 3LSB |
| 001 000 | 001 111 | 111 001 | CA10, 3LSB |
| 010 000 | 010 111 | 111 010 | CA10, 3LSB |
| 011 000 | 011 111 | 111 011 | CA10, 3LSB |
| 100 000 | 100 111 | 111 100 | CA10, 3LSB |
| 101 000 | 101 111 | 111 101 | CA10, 3LSB |
| 110 000 | 110 111 | 111 110 | CA10, 3LSB |

FIG. 3

APPARATUSES, SYSTEMS, AND METHODS FOR MANAGING METADATA STORAGE AT A MEMORY

BACKGROUND

This disclosure relates generally to semiconductor devices, such as semiconductor memory devices. The semiconductor memory device may include a memory array configured to store data. In some applications, metadata may be provided in addition to the data. Metadata can provide contextual or bibliographic-type information about the underlying data. The metadata may be used in the processing of the data, in some examples. However, storage and/or retrieval of metadata from the memory array corresponding to respective data may consume considerable time, as multiple steps may be necessary to locate a storage location of the metadata prior to storing or retrieving it.

BRIEF DESCRIPTION OF THE DRAWINGS

FIG. 3 includes example tables for mapping of metadata columns and column planes in according to some embodiments of the present disclosure.

DETAILED DESCRIPTION

Figure 1:
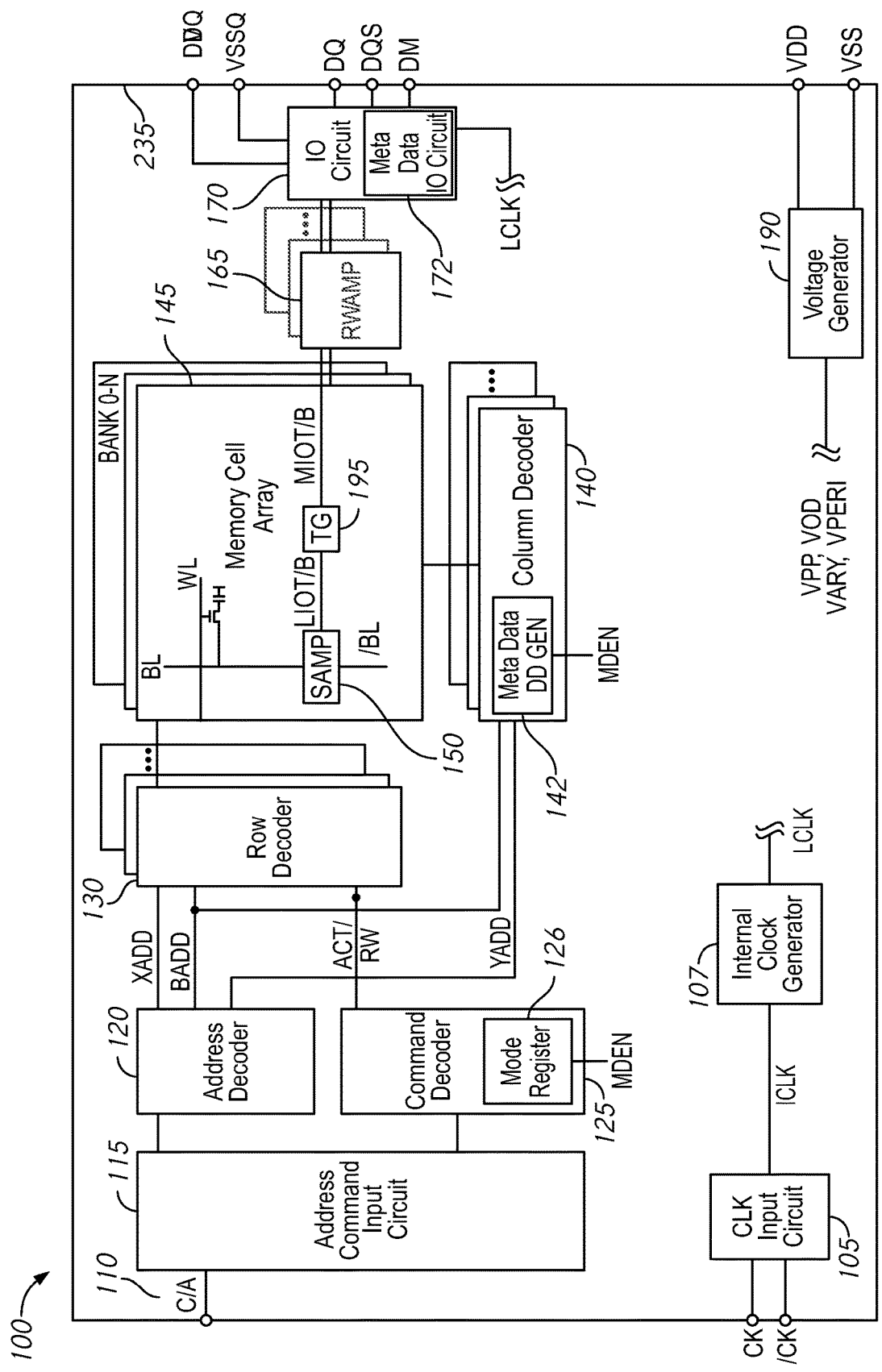
FIG. 1 is a block diagram of a semiconductor device according some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

This disclosure describes examples of a memory device configured with an internal metadata address generator configured to determine an address location where metadata associated with data stored at a particular address is located. For example, during a write operation, an address and corresponding write data may be received at the memory device. The write data may be stored at the received address. However, in addition to the write data, metadata corresponding to the write data may also be received at the memory device. The metadata may be additional data that has to be stored at a separate location from the write data. The internal metadata address generator may be configured to map a metadata address to the address associated with the write data. The metadata may be stored at the metadata address mapped to the address storing the write data. In a similar manner, during a read operation, a read address may be received. The internal metadata address generator may be configured to map the read address to a metadata address, which may include metadata corresponding to the read data stored at the read address. In some examples, the semiconductor device may perform a double-cycle access operations to store and retrieve both the underlying data, as well as the corresponding metadata.

Specifically, a memory array may be divided into a number of column planes each having a common number of columns. When data is stored at the memory array, it is split up such that a respective subset of the data is stored at a respective column of each column plane. During an access operation, only one column in a column plane can be accessed contemporaneously, so splitting up the data across multiple column planes allows all of the data to be stored in parallel. The same column address is used to identify the column within each column plane at which the data will be or is stored. For example, during a write operation, a particular column address may designate that column X is to be activated in each column plane to store data.

However, to preserve space for metadata, a subset of columns may be set aside to in each column plane to store the metadata. Because metadata (e.g., 8 or 16 bits) is a far smaller data set than the underlying data (e.g., 64, 128, etc. bits), not all column planes are needed to store metadata for a particular data set. For example, an array may include 16 column planes, each having 64 columns. Each column within a particular column plane may be capable of storing eight bits of data during one access operation. So, if column X is activated in each of 16 column planes, a total of 128 bits could be read or written in parallel. However, because corresponding metadata is a smaller number of bits (e.g., 8 or 16 bits), not all column planes would be necessary to store the metadata.

To determine which column plane is used to store the metadata, the internal metadata address generator may be configured to use the column address. In addition, because there are fewer column planes than columns within each plane, the address generator may be configured to use a subset of the column address bits to assign a particular column plane for storage of metadata corresponding to the column address. Thus, to map received read or write column addresses to corresponding metadata addresses, the internal metadata address generator may process a subset of bits of the column address to derive a column plane mapped to the metadata. For example, the internal metadata address generator may decode a subset of least-significant bits of the column address to determine a unique column plane at which the metadata is stored. In some examples, the bits of the column address the internal metadata address generator may use to map to a column plane may be based on a number of bits of metadata and the system architecture (e.g., x4, x8, x16, etc.). Using a subset of the column address bits to map storage of metadata within the array may be more efficient in terms of hardware complexity and time consumption as compared with using the entire column address.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 145. The memory array 145 is shown as including a plurality of memory banks. In the embodiment of FIG. 1, the memory array 145 is shown as including eight memory banks BANK0-BANK7. More or fewer banks may be included in the memory array 145 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 130 and the selection of the bit lines BL is performed by a column decoder 140. In the embodiment of FIG. 1, the row decoder 130 includes a respective row decoder for each memory bank and the column decoder 140 includes a respective column decoder for each memory bank. The bit lines BL are coupled to a respective sense amplifier (SAMP) 150. Read data from the bit line BL is amplified by the sense amplifier SAMP, and transferred to read/write amplifiers and an error correction code (ECC) control circuit (RWAMP and ECC control circuit) 165 over complementary local data lines (LIOT/B), transfer gate (TG), and complementary main data lines (MIOT/B). Conversely, write data outputted from the RWAMP and ECC 120 is transferred to the sense amplifier SAMP 150 over the complementary main data lines MIOT/B, the transfer gate TG 195, and the complementary local data lines LIOT/B, and written in the memory cell MC coupled to the bit line BL.

The semiconductor device 100 may employ a plurality of external terminals that include command and address (C/A) terminals 110 coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to a clock input circuit 105. The external clocks may be complementary. The clock input circuit 105 generates an internal clock ICLK based on the CK and /CK clocks. The ICLK clock is provided to the command decoder 140 and to an internal clock generator 107. The internal clock generator 107 provides various internal clocks LCLK based on the ICLK clock. The LCLK clocks may be used for timing operation of various internal circuits. The internal data clocks LCLK are provided to the input/output circuit 170 to time operation of circuits included in the input/output circuit 170, for example, to data receivers to time the receipt of write data.

The C/A terminals may be supplied with memory addresses. The memory addresses supplied to the C/A terminals are transferred, via an address/command input circuit 115, to an address decoder 120. The address decoder 120 receives the address and supplies a decoded row address XADD to the row decoder 130 and supplies a decoded column address YADD to the column decoder 140. The address decoder 120 may also supply a decoded bank address BADD, which may indicate the bank of the memory array 145 containing the decoded row address XADD and column address YADD. The C/A terminals may be supplied with commands Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 140 via the address/command input circuit 115. The command decoder 140 includes circuits to decode the internal command signals to generate various internal signals and commands for performing operations. For example, the command decoder 140 may provide a row command signal to select a word line and a column command signal to select a bit line.

The device 100 may receive access commands. When the access command is a read command, and a bank address, a row address and a column address are timely supplied with the read command, a codeword including read data and read parity bits is read from memory cells in the memory array 145 corresponding to the row address and column address. The read command is received by the command decoder 140, which provides internal commands so that read data from the memory array 145 is provided to the RWAMP and ECC control circuit 120. The RWAMP and ECC control circuit 120 may use the parity bits in the codeword to determine if the codeword includes any errors, and if any errors are detected, may correct them to generate a corrected codeword (e.g., by changing a state of the identified bit(s) which are in error). The corrected codeword (without the parity bits) is output to outside the device 100 from the data terminals DQ via the input/output circuit 170.

The device 100 may receive an access command which is a write command. When the write command is received, and a bank address, a row address, and a column address are timely supplied as part of the write operation, and write data is supplied through the DQ terminals to the RWAMP and ECC control circuit 120. The write data supplied to the data terminals DQ is written to a memory cells in the memory array 145 corresponding to the row address and column address. The write command is received by the command decoder 140, which provides internal commands so that the write data is received by data receivers in the input/output circuit 170. Write clocks may also be provided to the external clock terminals for timing the receipt of the write data by the data receivers of the input/output circuit 170. The write data is supplied via the input/output circuit 170 to the RWAMP and ECC control circuit 120. The RWAMP and ECC control circuit 120 may generate a number of parity bits based on the write data, and the write data and the parity bits may be provided as a codeword to the memory array 145 to be written into the memory cells MC.

In some examples, the semiconductor device 100 may be configured to support a metadata feature that facilitates handling of metadata corresponding to particular data. For example, when write data is received via the DQ terminals, the semiconductor device 100 may be configured to also receive corresponding metadata, and to manage storage of the metadata such that it can be retrieved along with the particular data during a read operation. The metadata may be enabled via a mode register setting stored at the mode register 126. The mode register 126 may be configured to provide a metadata enable signal MDEN to indicate whether the metadata feature is enabled.

To further support the metadata feature, the input/output circuit 170 may include a metadata input/output circuit 172 that is configured to manage metadata received from the DQ terminals for storage at the memory array 145 during a write operation and manage metadata received from the memory array 145 for transmission to the DQ terminals during a read operation. In some examples, the metadata may be received and/or transmitted after the underlying data. The metadata may include fewer bits than the underlying data.

In addition, the column decoders 140 may each include a metadata address generator 142 configured to determine a metadata address storage location for metadata associated with the underlying read or write data. The memory array 145 may be divided into a number of column planes each having a common number of columns. When the underlying data is stored at the memory array 145, it is split up such that a respective subset of the data is stored at a respective column of each column plane. During an access operation, only one column in a column plane can be accessed contemporaneously, so splitting up the data across multiple column planes allows all of the underlying data to be stored in parallel. The same column address is used to identify the column within each column plane at which the data will be or is stored. For example, during a write operation, a particular column address may designate that column X is to be activated in each column plane to store write data.

However, to preserve space for metadata, a subset of columns within each column plane may be set aside to store the metadata. Because metadata (e.g., 8 or 16 bits) is a smaller data set than the underlying data (e.g., 64, 128, etc., bits), not all column planes are needed to store metadata for a particular data set. For example, the memory array 145 may include 16 column planes, each having 64 columns. Each column within a particular column plane may be capable of storing eight bits of data during one access operation. So, if column X is activated in each of 16 column planes, a total of 128 bits could be read or written in parallel. However, because corresponding metadata is a smaller number of bits (e.g., 8 or 16 bits), not all column planes would be necessary to store the metadata.

Accordingly, when write data and corresponding metadata is received, the metadata address generator 142 may be configured to map a metadata column plane to the column address associated with the write data. In a similar manner, during a read operation, when read data and corresponding metadata is requested, the metadata address generator 142 may be configured to map the read column address to a metadata column plane storing the corresponding metadata. In some examples, the semiconductor device 100 may perform a double-cycle access operations to store and retrieve both the underlying data, as well as the corresponding metadata.

To determine which column plane is used to store the metadata, the metadata address generator 142 may be configured to use a subset of the column address bits to assign a particular column plane for storage of metadata corresponding to the column address. For example, the metadata address generator 142 may decode a subset of least-significant bits of the column address to determine a unique column plane at which the metadata is stored. In some examples, the bits of the column address the internal metadata address generator may use to map to a column plane may be based on a number of bits of metadata and the system architecture (e.g., channel width (e.g., x4, x8, x16, etc.) and data size (e.g., 4 bytes, 8 bytes, 16 bytes, etc.)). In some examples, the metadata address generator 142 may use a subset of the column address bits, along with other fixed or one or more other command address bits (e.g., CA10) to map a column address to a metadata address. Using a subset of the column address bits to map storage of metadata within the array may be more efficient in terms of hardware complexity and time consumption as compared with using the entire column address.

The power supply terminals are supplied with power supply potentials VDD and VSS. The power supply potentials VDD and VSS are supplied to a voltage generator circuit 190. The voltage generator circuit 190 generates various internal potentials VPP, VOD, VARY, VPERI, and the like based on the power supply potentials VDD and VSS supplied to the power supply terminals. The internal potential VPP is mainly used in the row decoder 130, the internal potentials VOD and VARY are mainly used in the sense amplifiers SAMP included in the memory array 145, and the internal potential VPERI is used in many peripheral circuit blocks.

The power supply terminals are also supplied with power supply potentials VDDQ and VSSQ. The power supply potentials VDDQ and VSSQ are supplied to the input/output circuit 170. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 170 so that power supply noise generated by the input/output circuit 170 does not propagate to the other circuit blocks.

Figure 2:
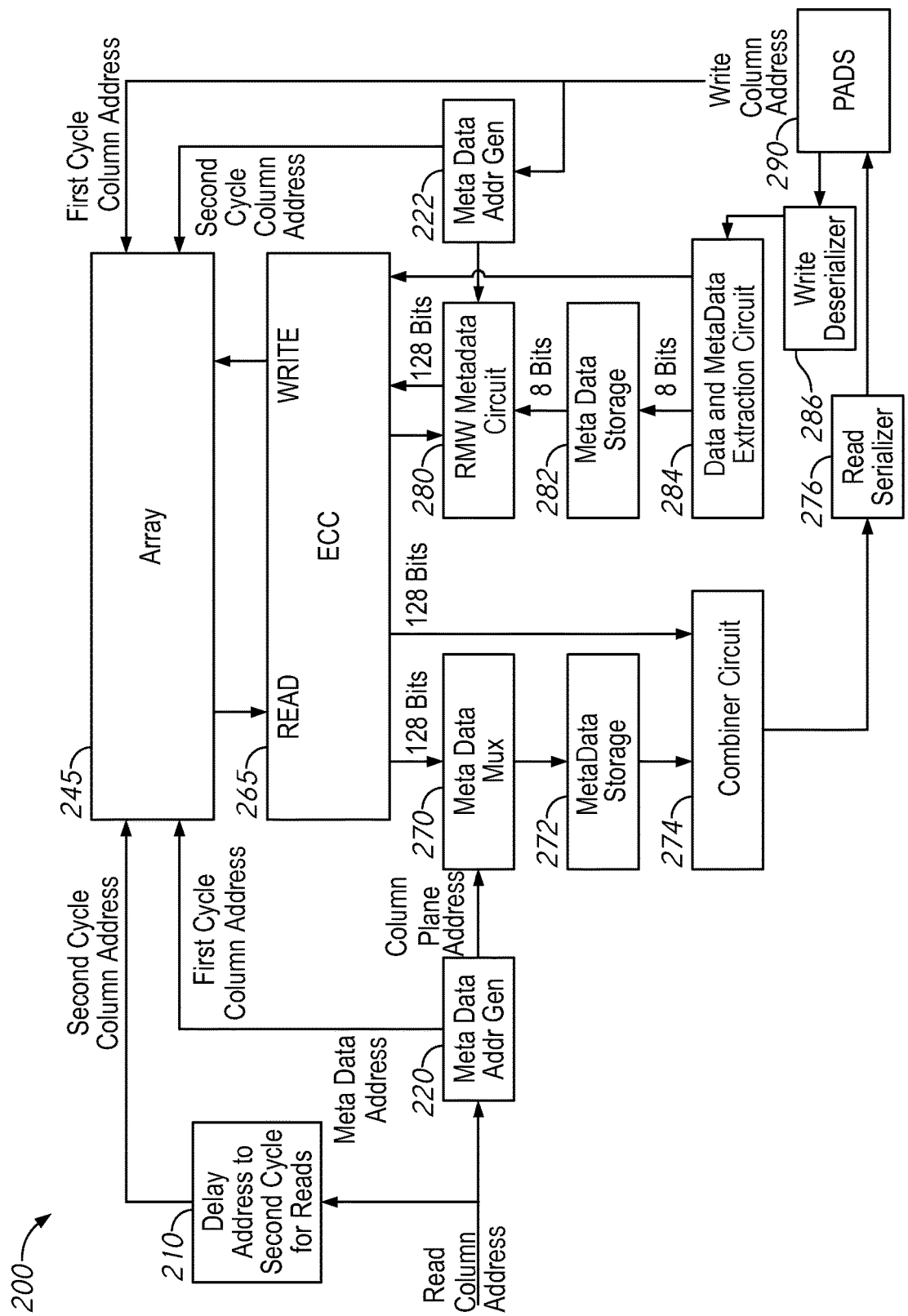
FIG. 2 is a block diagram of a semiconductor device 200 according to some embodiments of the present disclosure.

FIG. 2 is a block diagram of a semiconductor device 200 according to some embodiments of the present disclosure. In some examples, the semiconductor device 200 may be configured to support a metadata feature that facilitates handling of metadata corresponding to particular data. The semiconductor device 200 may include a memory array 245 coupled to an ECC control circuit 265. The memory array 245 may include multiple column planes each having a respective number of columns.

The semiconductor device 200 may further include a delay circuit 210, a metadata address generator 220, a metadata multiplexer 270, a metadata storage 272, and a combiner circuit 274 to support read metadata address generation and operation. During a read operation, the delay circuit 210 and the metadata address generator 220 may receive a read column address. The semiconductor device 200 may perform a double cycle read operation to read both the underlying read data associated with the read column address and the corresponding metadata. The metadata address generator 220 may provide the metadata address to the memory array 245 as the first cycle column address and a metadata column plane to the metadata multiplexer 270 during the first read cycle to cause the memory array 245 to provide the metadata associated with the read column address to the ECC control circuit 265. The ECC control circuit 265 may perform an ECC operation to provide corrected first cycle data corresponding to the first cycle column address to the metadata multiplexer 270. The metadata multiplexer 270 may filter the metadata from the first cycle read data based on the column plane address provided from the metadata address generator 220. The metadata storage 272 may be configured to store or latch the metadata while the underlying read data is retrieved during the second read cycle. After a delay to allow the first read cycle to complete, the delay circuit 210 may provide the read column address to the memory array 245 as the second cycle column address to cause the memory array 245 to provide the read data associated with the read column address to the ECC control circuit 265. The ECC control circuit 265 may perform an ECC operation on the read data to provide corrected read data to the combiner circuit 274. Upon receipt of the read data, the combiner circuit 274 may combine the read data with the metadata latched at the metadata storage 272 to provide combined read data to the read serializer 276. The read serializer 276 may serialize the combined read data for provision over to DQ pads 290 coupled to a data bus.

The semiconductor device 200 may further include a metadata address generator 222, a read-modify-write metadata circuit 280, a metadata storage 282, and a write data and metadata extraction circuit 284 to support write metadata address generation and operation. During a write operation, the metadata address generator 222 and the memory array 245 may receive a write column address. In parallel, write data and corresponding metadata may be received at the DQ pads 290 from a data bus. The write de-serializer 286 may de-serialize the write data and corresponding metadata received at the DQ pads 290, and may provide the de-serialized write data and metadata to the write data and metadata extraction circuit 284. The write data and metadata extraction circuit 284 may be configured to split the write data from the metadata, and provide the write data to the ECC control circuit 265 and the metadata to the metadata storage 282 to be temporarily stored or latched. To write both the write data and the metadata, the semiconductor device 200 may perform a double cycle write operation. During the first write cycle, the write column address may be provided directly to the memory array 245 as the first cycle column address to cause the memory array 245 to write the write data provided from the write data and metadata extraction circuit 284 (and corrected via the ECC control circuit 265) to a location within the memory array 245 corresponding to the write column address. As part of the second write cycle, the semiconductor device 200 may perform a read-modify-write operation to read data from the memory array 245, modify the data to include the metadata, and write the data back to the memory array 245. Accordingly, the metadata address generator 222 may provide the metadata column address as the second cycle column address to the memory array 245 to first perform a read operation to retrieve second cycle data corresponding to the second cycle column address from the memory array 245. The metadata address generator 222 may also provide a metadata column plane address to the read-modify-write metadata circuit 280. The second cycle data may be corrected via the ECC control circuit 265, and provided to the read-modify-write metadata circuit 280. The read-modify-write metadata circuit 280 may be configured to replace selected portions of the read data identified based on the metadata column plane address provided from the metadata address generator 222 with the metadata to provide modified second cycle data. The write data and metadata extraction circuit 284 may then provide the modified second cycle data to the ECC control circuit 265, which may be written to the memory array 245 at a location corresponding to the second cycle column address provided form the metadata address generator 222.

The metadata address generator 220 and the metadata address generator 222 may each be configured to determine an address location where metadata associated with the underlying read or write data for storage of the metadata, including a column plane. The memory array 245 may be divided into a number of column planes each having a common number of columns. When the underlying read or write data is stored at the memory array 245, it may be split up such that a respective subset of the data is stored at a respective column of each column plane. During an access operation, only one column in a column plane can be accessed contemporaneously, so splitting up the data across multiple column planes allows all of the underlying data to be stored in parallel. The same column address is used to identify the column within each column plane at which the data will be or is stored. For example, during a write operation, a particular column address may designate that column X is to be activated in each column plane to store write data.

However, to preserve space for metadata, a subset of columns within each column plane of the memory array 245 may be set aside to store the metadata. Because metadata (e.g., 8 or 16 bits) is a smaller data set than the underlying data (e.g., 64, 128, etc., bits), not all column planes are needed to store metadata for a particular data set. For example, the memory array 245 may include 16 column planes, each having 64 columns. Each column within a particular column plane may be capable of storing eight bits of data during one access operation. So, if column X is activated in each of 16 column planes, a total of 128 bits could be read or written in parallel. However, because corresponding metadata is a smaller number of bits (e.g., 8 or 16 bits), not all column planes would be necessary to store the metadata.

Accordingly, when write data and corresponding metadata is received, the metadata address generator 222 may be configured to map a metadata column plane to the column address associated with the write data. In a similar manner, during a read operation, when read data and corresponding metadata is requested, the metadata address generator 220 may be configured to map the read column address to a metadata column plane storing the corresponding metadata.

To determine which column plane is used to store the metadata, the metadata address generator 220 and the metadata address generator 222 may be configured to use a subset of the column address bits to assign a particular column plane for storage of metadata corresponding to the column address. For example, the metadata address generator 220 and/or the metadata address generator 222 may decode a subset of least-significant bits of the column address to determine a unique column plane at which the metadata is stored. In some examples, the bits of the column address the internal metadata address generator may use to map to a column plane may be based on a number of bits of metadata and the system architecture (e.g., channel width (e.g., x4, x8, x16, etc.) and data size (e.g., 4 bytes, 8 bytes, 16 bytes, etc.)). In some examples, the metadata address generator 220 and/or the metadata address generator 222 may use a subset of the column address bits, along with other fixed or other command and address bits (e.g., CA10) to map a column address to a metadata address. Using a subset of the column address bits to map storage of metadata within the array may be more efficient in terms of hardware complexity and time consumption as compared with using the entire column address.

FIG. 3 includes example tables 300, 301, 302, 303 for mapping of metadata columns and column planes in according to some embodiments of the present disclosure. The mapping depicted in tables 300, 301, 302, and 303 may be implemented via the metadata address generator 142 of FIG. 1, the metadata address generator 220 and/or the metadata address generator 222 of FIG. 2, or any combination thereof. It is appreciated that the metadata column addresses and column plane mapping depicted in tables 300, 301, 302, and 303 are exemplary, and other metadata column address and column plane mapping may be implemented without departing from the scope of the disclosure.

Table 300 depicts exemplary metadata column address and column plane mapping for a x8, 8 byte architecture. As shown in the top portion of table 300, metadata column 56 is associated with columns 0-7, metadata column 57 is associated with columns 8-15, etc. Column 63 is unused in this example. In the lower portion of the table 300, the column address start and end range may be used to map to a particular metadata column address and a particular metadata storage column plane. For example, the metadata column address may be determined by the three LSB of the column address, and the two metadata column planes may be determined based on a 0 combined with 3 LSB and a 1 combined with 3 LSB of the column address.

Table 301 depicts exemplary metadata column address and column plane mapping for a x8, 4 byte architecture. As shown in the top portion of table 301, metadata column 60 is associated with columns 0-15, metadata column 61 is associated with columns 16-31, etc. In the lower portion of the table 301, the column address start and end range may be used to map to a particular metadata column address and a particular metadata storage column plane. For example, the metadata column address may be determined based on the bottom 3 LSB of the column address, and the metadata column plane may be determined based on the 4 LSB of the column address.

Table 302 depicts exemplary metadata column address and column plane mapping for a x4, 4 byte architecture. As shown in the top portion of table 302, metadata column 60 is associated with columns 0-15, metadata column 61 is associated with columns 16-31, etc. In the lower portion of the table 302, the column address start and end range may be used to map to a particular metadata column address and a particular metadata storage column plane. For example, the metadata column address may be determined based on the bottom 3 LSB of the column address, and the metadata column plane may be determined based on a column address bit 10 (CA10) plus 3 LSB of the column address.

Table 303 depicts exemplary metadata column address and column plane mapping for a x4, 8 byte architecture. As shown in the top portion of table 303, metadata column 56 is associated with columns 0-7, metadata column 57 is associated with columns 8-15, etc. In the lower portion of the table 303, the column address start and end range may be used to map to a particular metadata column address and a particular metadata storage column plane. For example, the metadata column address may be determined based on the bottom 3 LSB of the column address, and the metadata column plane may be determined based on a column address bit 10 (CA10) plus 3 LSB of the column address.

The boxes shown as part of the method 300 represents steps which happen as part of an ECS cycle, however individual ECS operations may be separated by time and location in the memory. For example, between ECS operations (e.g., between times that box 305 is performed) the memory may perform various other operations such as refresh operations, access operations, etc. Similarly, the method 300 may include performing ECS operations on different banks at different times. For example, the method 300 may include performing a first ECS operation (e.g., starting with box 305) on a first bank and if an error is detected updating a first per-row counter associated with that bank, then performing a second ECS operation on a second bank and if an error is detected updating a second per-row ECS counter before returning to perform a third ECS operation on the first bank.

Figure 4:
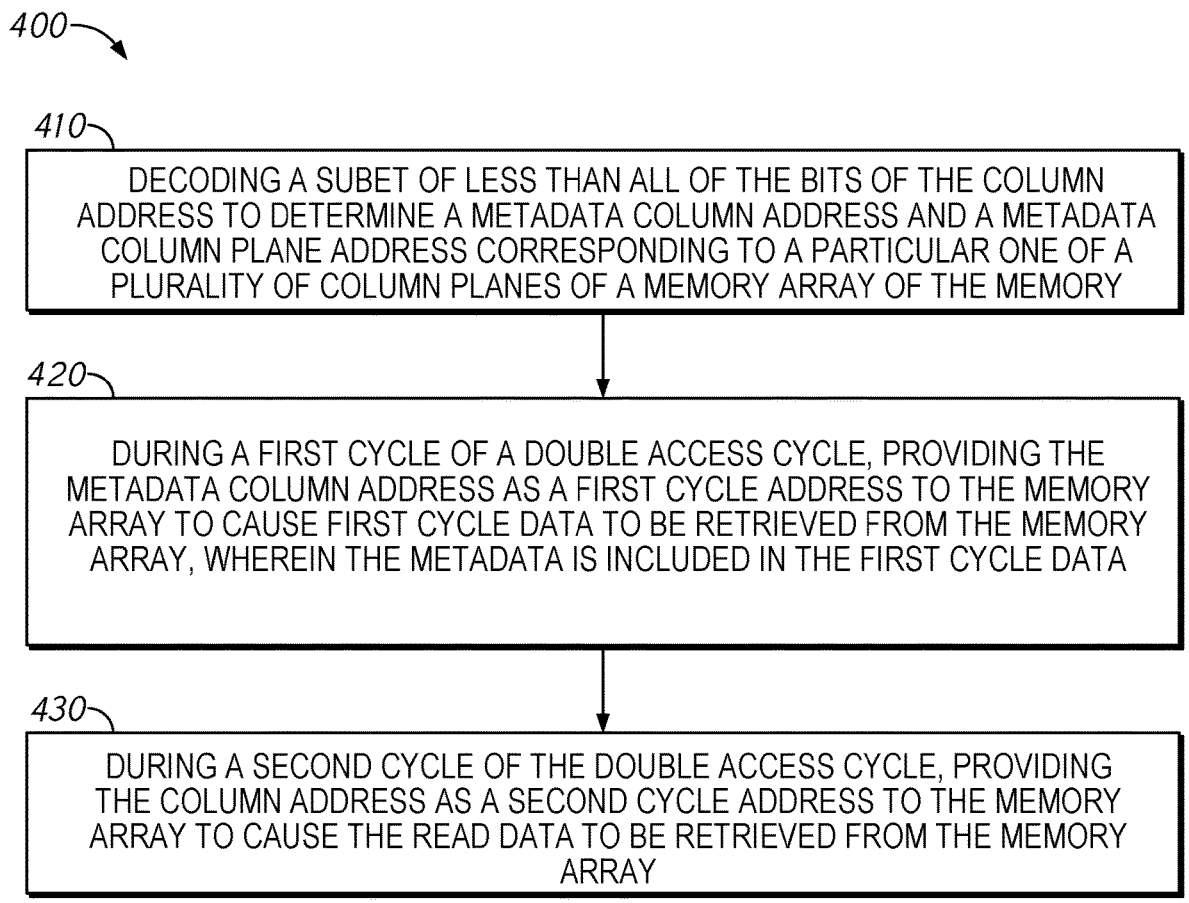
FIG. 4 is a flow chart of a method to perform a read operation to retrieve read data and corresponding metadata from a memory according to some embodiments of the present disclosure.

FIG. 4 is a flow chart of a method 400 to perform a read operation to retrieve read data and corresponding metadata from a memory according to some embodiments of the present disclosure. The method 400 may, in some embodiments, be implemented by the memory 100 of FIG. 1 and/or the semiconductor device 200 of FIG. 2. The method 400 may be performed during a read operation at a memory to retrieve read data and metadata associated with a column address.

The method 400 includes decoding a subset of less than all of the bits of the column address to determine a metadata column address and a metadata column plane address corresponding to a particular one of a plurality of column planes of a memory array of the memory, at 410. In some examples, the method 400 may further include determining the metadata column plane address based on a least significant bit of the column address. In some examples, the method 400 may further include determining the metadata column plane address based on 3 or 4 least significant bits of the column address. In some examples, the method 400 may further include determining the metadata column plane address based on a combination of a subset of least significant bits of the column address and another column address. In some examples, the method 400 may further include determining which bits of the column address to use to decode the based on a system architecture of the memory (e.g., bus width and data size.)

The method 400 further includes, during a first cycle of a double access cycle, providing the metadata column address as a first cycle address to the memory array to cause first cycle data to be retrieved from the memory array, at 420. The metadata may be included in the first cycle data. In some examples, the method 400 may include extracting the metadata from the first cycle data based on the metadata column plane address. In some examples, the method 400 may further include latching the metadata while read data is being retrieved during the second cycle of the double access cycle.

The method 400 further comprising, during a second cycle of the double access cycle, providing the column address as a second cycle address to the memory array to cause the read data to be retrieved from the memory array, at 430. In some examples, the method 400 may further include combining the read data and the metadata for provision to a data bus.

Figure 5:
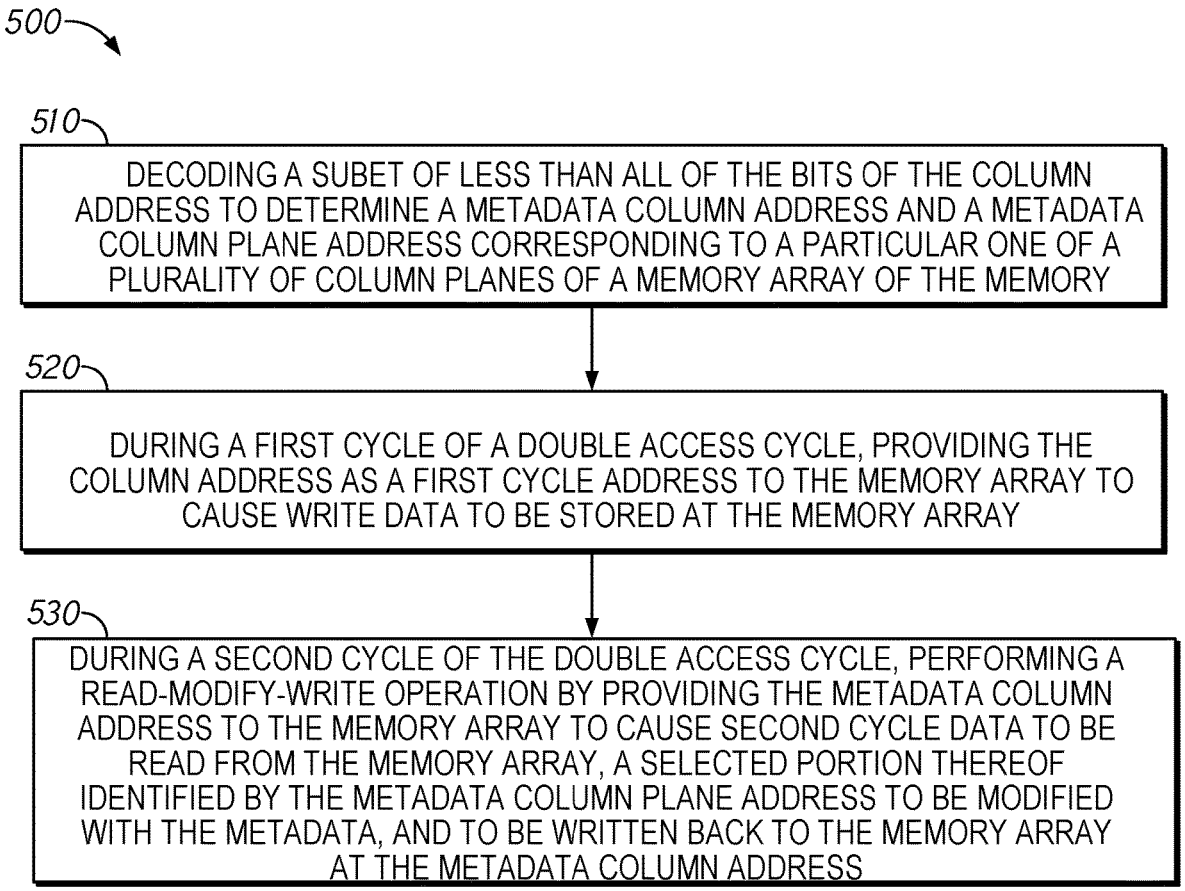
FIG. 5 is a flow chart of a method to perform a write operation to store write data and corresponding metadata at a memory according to some embodiments of the present disclosure.

FIG. 5 is a flow chart of a method 500 to perform a write operation to store write data and corresponding metadata at a memory according to some embodiments of the present disclosure. The method 500 may, in some embodiments, be implemented by the memory 100 of FIG. 1 and/or the semiconductor device 200 of FIG. 2. The method 500 may be performed during a write operation at a memory to retrieve read data and metadata associated with a column address.

The method 500 includes decoding a subset of less than all of the bits of the column address to determine a metadata column address and a metadata column plane address corresponding to a particular one of a plurality of column planes of a memory array of the memory, at 510. In some examples, the method 500 may further include receiving bus data that includes both the write data and the metadata, and extracting the metadata from the bus data. In some examples, the method 500 may further include latching the extracted metadata during the first cycle of the double access cycle. In some examples, the method 500 may further include determining the metadata column plane address based on a least significant bit of the column address. In some examples, the method 500 may further include determining the metadata column plane address based on 3 or 4 least significant bits of the column address. In some examples, the method 500 may further include determining the metadata column plane address based on a combination of a subset of least significant bits of the column address and another column address. In some examples, the method 500 may further include determining which bits of the column address to use to decode the based on a system architecture of the memory (e.g., bus width and data size.)

The method 500 further includes during a first cycle of a double access cycle, providing the column address as a first cycle address to the memory array to cause write data to be stored at the memory array, at 520. In some examples, the method 500 may include extracting the metadata from the first cycle data based on the metadata column plane address. In some examples, the method 500 may further include latching the metadata while read data is being retrieved during the second cycle of the double access cycle.

The method 500 further comprising during a second cycle of the double access cycle, performing a read-modify-write operation by providing the metadata column address to the memory array to cause second cycle data to be read from the memory array, a selected portion thereof identified by the metadata column plane address to be modified with the metadata, and to be written back to the memory array at the metadata column address, at 530. In some examples, the method 500 may further include replacing the selected portion of the second cycle data identified based on the metadata column plane address with the metadata.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a memory array comprising a plurality of column planes;
a column decoder comprising a metadata column address generator, wherein during an metadata access operation, the column decoder is configured to receive a column address derived identifying a particular column to be accessed within each of the plurality of column planes, wherein the metadata column address generator is configured to decode a subset of less than all of the bits of the column address to determine a metadata column address and a metadata column plane address corresponding to a particular one of the plurality of column planes, wherein the column decoder is configured to facilitate a double cycle access operation to at least one of write data to and retrieve data from each of the plurality of column planes based on the column address and to at least one of write metadata to and retrieve metadata from a particular column corresponding to the metadata column address of the particular one of the plurality of column planes corresponding to the column plane address.

2. The apparatus of claim 1, wherein for a read operation:
during a first cycle of the double access cycle, the column decoder is configured to provide the metadata column address as a first cycle address to the memory array to cause first cycle data to be retrieved from the memory array, wherein the metadata is included in the first cycle data; and
during a second cycle of the double access cycle, the column decoder is configured to provide the column address as a second cycle address to the memory array to cause read data to be retrieved from the memory array.

3. The apparatus of claim 2, further comprising a metadata input/output circuit configured to extract the metadata from the first cycle data based on the metadata column plane address and to combine the metadata with the read data received from the second cycle of the double access cycle.

4. The apparatus of claim 3, wherein the metadata input/output circuit includes a multiplexer configured to extract the metadata from the first cycle data based on the metadata column address.

5. The apparatus of claim 3, wherein the metadata input/output circuit includes a latch circuit configured to store the metadata while read data is being retrieved during the second cycle of the double access cycle.

6. The apparatus of claim 1, wherein for a write operation:
during a first cycle of the double access cycle, the column decoder is configured to provide the column address as a first cycle address to the memory array to cause write data to be stored at the memory array; and
during a second cycle of the double access cycle, the column decoder is configured to
provide the metadata column address to cause second cycle data to be read from the memory array and modified second cycle data to be written to the memory, wherein a selected portion of the second cycle data identified by the metadata column plane address is replaced with the metadata to provide the modified second cycle data.

7. The apparatus of claim 6, further comprising a metadata input/output circuit configured to receive the write data and the metadata, and to extract the metadata from the write data, wherein the metadata input/output circuit is further configured to replace the selection portion of the second cycle data with the metadata based on the metadata column plane address.

8. The apparatus of claim 7, wherein the metadata input/output circuit includes a read-modify-write circuit configured to replace the selected portion of the second cycle data identified based on the metadata column plane address with the metadata.

9. The apparatus of claim 8, wherein the metadata input/output circuit includes an extraction circuit configured to extract the write data and the metadata from data received via a data bus, wherein the extraction circuit is configured to provide the write data to the memory array.

10. The apparatus of claim 9, wherein the metadata input/output circuit includes a latch circuit configured to receive the metadata from the extraction circuit and store the metadata while the second cycle data is being retrieved during the second cycle of the double access cycle.

11. The apparatus of claim 9, wherein the metadata column address generator is configured to decode 4 or fewer of the least significant bits of the column address to determine the metadata column address and the metadata column plane address corresponding to the particular one of the plurality of column planes.

12. A method comprising:
during a read operation at a memory to retrieve read data and metadata associated with a column address:
decoding a subset of less than all of the bits of the column address to determine a metadata column address and a metadata column plane address corresponding to a particular one of a plurality of column planes of a memory array of the memory;
during a first cycle of a double access cycle, providing the metadata column address as a first cycle address to the memory array to cause first cycle data to be retrieved from the memory array, wherein the metadata is included in the first cycle data; and
during a second cycle of the double access cycle, providing the column address as a second cycle address to the memory array to cause the read data to be retrieved from the memory array.

13. The method of claim 12, further comprising extracting the metadata from the first cycle data based on the metadata column plane address.

14. The method of claim 13, further comprising combining the read data and the metadata for provision to a data bus.

15. The method of claim 13, further comprising latching the metadata while read data is being retrieved during the second cycle of the double access cycle.

16. The method of claim 12, further comprising determining the metadata column plane address based on a least significant bit of the column address.

17. The method of claim 12, further comprising determining the metadata column plane address based on 3 or 4 least significant bits of the column address.

18. The method of claim 12, further comprising determining the metadata column plane address based on a combination of a subset of least significant bits of the column address and another column address.

19. A method comprising:
during a write operation at a memory to store write data and metadata associated with a column address:
decoding a subset of less than all of the bits of the column address to determine a metadata column address and a metadata column plane address corresponding to a particular one of a plurality of column planes of a memory array of the memory;
during a first cycle of a double access cycle, providing the column address as a first cycle address to the memory array to cause write data to be stored at the memory array; and
during a second cycle of the double access cycle, performing a read-modify-write operation by providing the metadata column address to the memory array to cause second cycle data to be read from the memory array, a selected portion thereof identified by the metadata column plane address to be modified with the metadata, and to be written back to the memory array at the metadata column address.

20. The method of claim 19, further comprising:
receiving bus data that includes both the write data and the metadata; and
extracting the metadata from the bus data.

21. The method of claim 20, further comprising replacing the selected portion of the second cycle data identified based on the metadata column plane address with the metadata.

22. The method of claim 20, further comprising latching the extracted metadata during the first cycle of the double access cycle.

23. The method of claim 19, further comprising determining the metadata column plane address based on a least significant bit of the column address.

24. The method of claim 19, further comprising determining the metadata column plane address based on 3 or 4 least significant bits of the column address.

25. The method of claim 19, further comprising determining the metadata column plane address based on a combination of a subset of least significant bits of the column address and another column address.

26. The method of claim 19, further comprising determining which bits of the column address to use to decode based on a system architecture of the memory.

* * * * *